(12) United States Patent
Yoshida et al.

(10) Patent No.: US 10,386,248 B2
(45) Date of Patent: Aug. 20, 2019

(54) STRETCHABLE ELECTRICALLY-CONDUCTIVE CIRCUIT AND MANUFACTURING METHOD THEREFOR

(71) Applicant: National Institute of Advanced Industrial Science and Technology, Tokyo (JP)

(72) Inventors: Manabu Yoshida, Tsukuba (JP); Sei Uemura, Tsukuba (JP); Taiki Nobeshima, Tsukuba (JP)

(73) Assignee: National Institute of Advanced Industrial Science and Technology, Tokyo (JP)

(*) Notice: Subject to any disclaimer, the term of this patent is extended or adjusted under 35 U.S.C. 154(b) by 268 days.

(21) Appl. No.: 15/311,659

(22) PCT Filed: May 14, 2015

(86) PCT No.: PCT/JP2015/063943
§ 371 (c)(1),
(2) Date: Feb. 3, 2017

(87) PCT Pub. No.: WO2015/174505
PCT Pub. Date: Nov. 19, 2015

(65) Prior Publication Data
US 2017/0153152 A1   Jun. 1, 2017

(30) Foreign Application Priority Data

May 16, 2014  (JP) .............................. 2014-102087
Dec. 12, 2014  (JP) .............................. 2014-252330

(51) Int. Cl.
*G01L 1/00* (2006.01)
*G01L 1/14* (2006.01)
(Continued)

(52) U.S. Cl.
CPC .............. *G01L 1/144* (2013.01); *B32B 25/10* (2013.01); *H01B 5/00* (2013.01); *H01B 5/02* (2013.01);
(Continued)

(58) Field of Classification Search
CPC ................................. G01L 1/144; B32B 25/10
See application file for complete search history.

(56) References Cited

U.S. PATENT DOCUMENTS

2018/0033520 A1* 2/2018 Yoshida ................... H01B 7/06

FOREIGN PATENT DOCUMENTS

JP    03179794 A   *  8/1991
JP    H03-179794 A    8/1991
(Continued)

OTHER PUBLICATIONS

Japanese Office Action dated Aug. 7, 2017 and its English Translation.
(Continued)

*Primary Examiner* — Jamel E Williams
(74) *Attorney, Agent, or Firm* — McCormick, Paulding & Huber LLP

(57) ABSTRACT

A stretchable electrically-conductive sheet according to the present invention includes an elastomer sheet 1 having an adhesive layer corresponding to a wiring region with a predetermined pattern formed on a front surface of the elastomer sheet, and also includes electrically-conductive fiber materials 2 each having a predetermined diameter and a predetermined length. When the elastomer sheet 1 is stretched or bended, the electrically-conductive fiber materials relatively move maintaining mutual electrical continuity so as to maintain the electrical continuity in the wiring region. Accordingly, it is possible to achieve a low-cost
(Continued)

stretchable electrically-conductive circuit having excellent stretchability, bendability, and durability.

11 Claims, 15 Drawing Sheets

(51) Int. Cl.
| | |
|---|---|
| *B32B 25/10* | (2006.01) |
| *H01B 5/00* | (2006.01) |
| *H01B 5/02* | (2006.01) |
| *H01B 5/14* | (2006.01) |
| *H01B 7/06* | (2006.01) |
| *H01B 13/00* | (2006.01) |
| *H01R 11/01* | (2006.01) |
| *H05K 1/02* | (2006.01) |
| *H05K 3/14* | (2006.01) |
| *H05K 3/10* | (2006.01) |
| *H01G 5/18* | (2006.01) |
| *H05K 1/03* | (2006.01) |

(52) U.S. Cl.
CPC ............... *H01B 5/14* (2013.01); *H01B 7/06* (2013.01); *H01B 13/00* (2013.01); *H01R 11/01* (2013.01); *H05K 1/0283* (2013.01); *H05K 3/103* (2013.01); *H05K 3/143* (2013.01); *H01G 5/18* (2013.01); *H05K 1/0393* (2013.01); *H05K 2201/0133* (2013.01); *H05K 2201/0314* (2013.01)

(56) References Cited

FOREIGN PATENT DOCUMENTS

| | | | | |
|---|---|---|---|---|
| JP | 2000071418 A | | 3/2000 | |
| JP | 2001047728 A | | 2/2001 | |
| JP | 2006-153471 A | | 6/2006 | |
| JP | 2008-108583 A | | 5/2008 | |
| JP | 2008108583 A | * | 5/2008 | ............... H02K 3/02 |
| JP | 2009-141129 A | | 6/2009 | |
| JP | 2009141129 A | * | 6/2009 | |
| JP | 2011-034822 A | | 2/2011 | |
| JP | 2012-168064 A | | 9/2012 | |
| JP | 2013-187380 A | | 9/2013 | |
| JP | 2013-206080 A | | 10/2013 | |
| JP | 2014-077952 A | | 5/2014 | |
| JP | 2018010504 A | * | 1/2018 | |
| WO | 2009102077 A1 | | 8/2009 | |

OTHER PUBLICATIONS

Tahmina Akter et al. "Reversibly Stretchable Transparent Conductive Coatings of Spray-Deposited Silver Nanowires", ACS Applied Materials & Interfaces. vol. 4, No. 4, Apr. 25, 2012 (Apr. 25, 2012), pp. 1855-1859.

Extended European Search Report for Serial No. 15 793 6105 dated Jan. 30, 2018.

International Search Report for PCT Serial No. PCT/JP2015/063943 dated Jun. 26, 2015.

* cited by examiner

FIG. 1
(a) INITIAL STATE
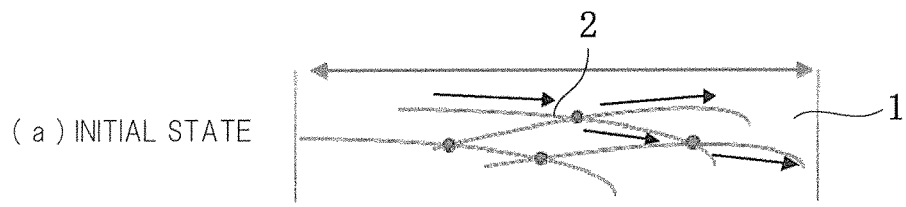
(b) STATE 1
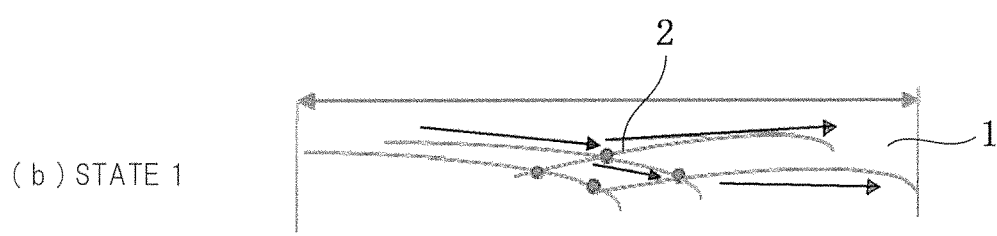
(c) STATE 2
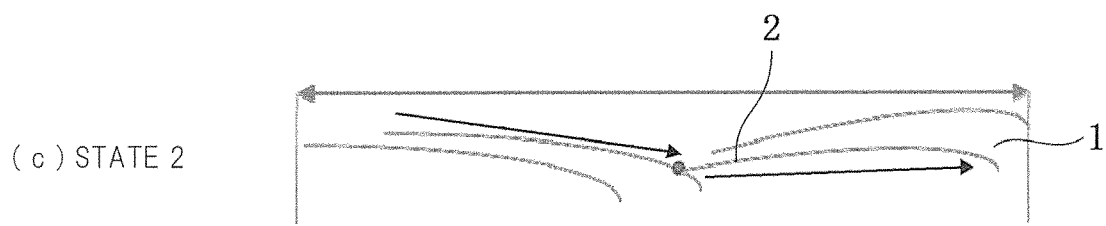
FIG. 2
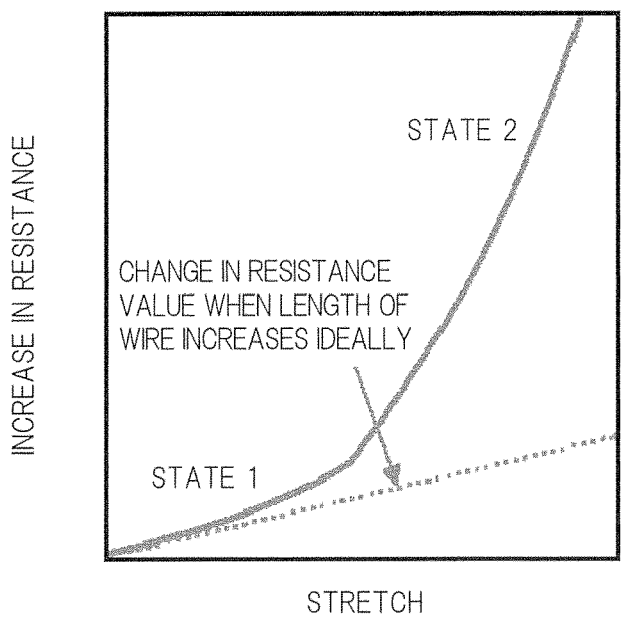

| STRETCH RATE (%) | SHEET RESISTANCE (Ω/□) |
|---|---|
| 0.0 | 13.4 |
| 42.9 | 19.2 |
| 71.4 | 20.1 |
| 100.0 | 23.1 |
| 185.7 | 27.2 |
| 242.9 | 25 |

FIG. 7
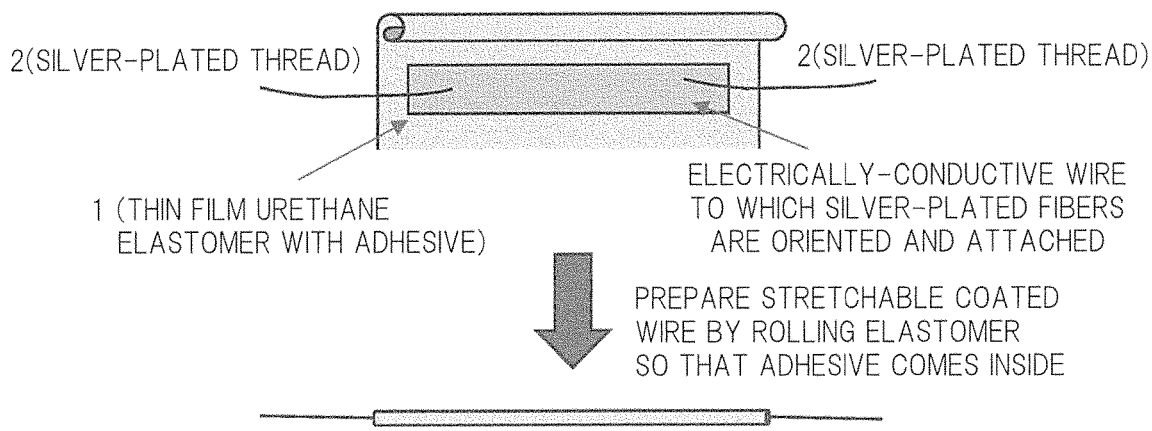
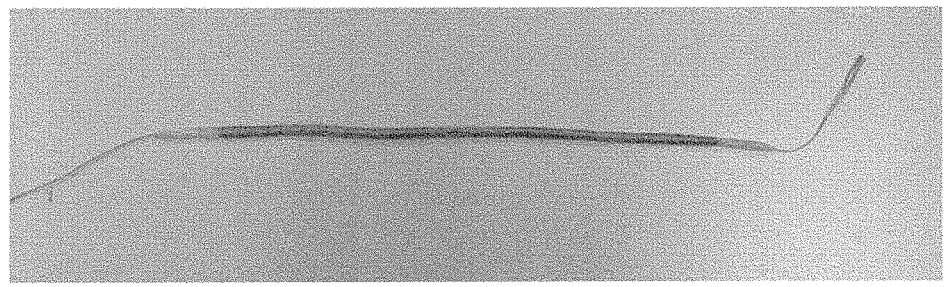
FIG. 8
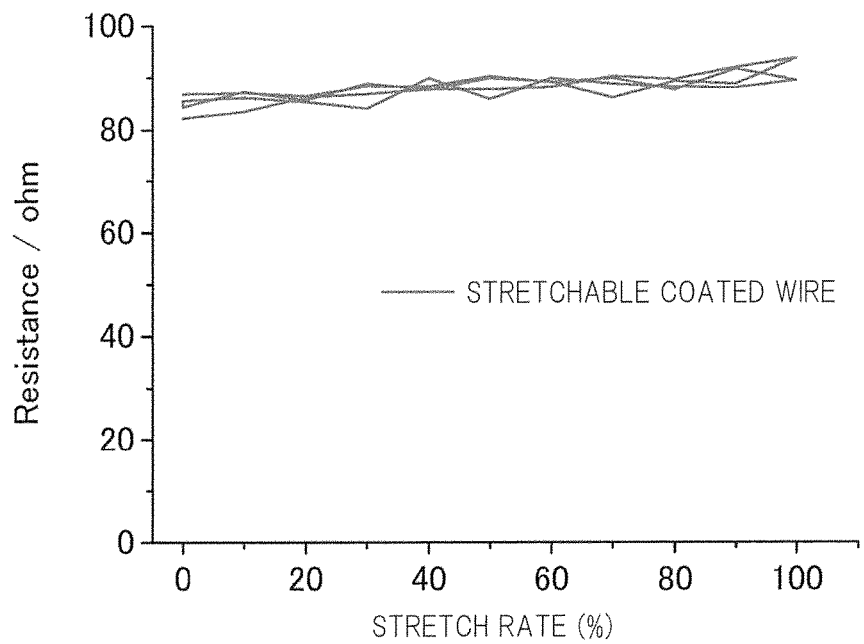
RESISTANCE VALUE IS UNCHANGED WITH RESPECT TO STRETCH WIRES HAVING THE SAME LINE WIDTH INTERSECT
PERPENDICULARLY, SO THAT OVERLAPPING
PORTION FUNCTIONS AS CAPACITOR

CORRELATION BETWEEN NUMBER OF INTERLAYERS AND CAPACITANCE VALUE

| ELEMENT | INITIAL STATE (Ω) | AFTER TRANSFORMED AND LOADED (Ω) | CHANGE RATE | STRETCH RATE |
|---|---|---|---|---|
| R1 | 11 | 12.8 | 16% | 20% |
| R2 | 11.7 | 14.4 | 23% | 40% |
| R3 | 14.4 | 16.5 | 15% | 60% |
| R4 | 12.5 | 13.5 | 8% | 20% |
| R5 | 12.5 | 12.6 | 1% | 0% |
| R6 | 13.3 | 13.3 | 0% | 0% |
| R7 | 15.8 | 15.8 | 0% | 0% |
| R8 | 16.4 | 16.9 | 3% | 0% |

| ELEMENT | INITIAL STATE (pF) | AFTER TRANSFORMED AND LOADED (pF) | AMOUNT OF CHANGE (pF) | LOAD (g) |
|---|---|---|---|---|
| C1 | 82 | 82 | 0 | 0 |
| C2 | 85 | 85 | 0 | 0 |
| C3 | 77 | 80 | 3 | 23 |
| C4 | 76 | 76 | 0 | 0 |
| C5 | 88 | 88 | 0 | 0 |
| C6 | 81 | 81 | 0 | 0 |
| C7 | 72 | 75 | 3 | 23 |
| C8 | 88 | 88 | 0 | 0 |

FIG. 23
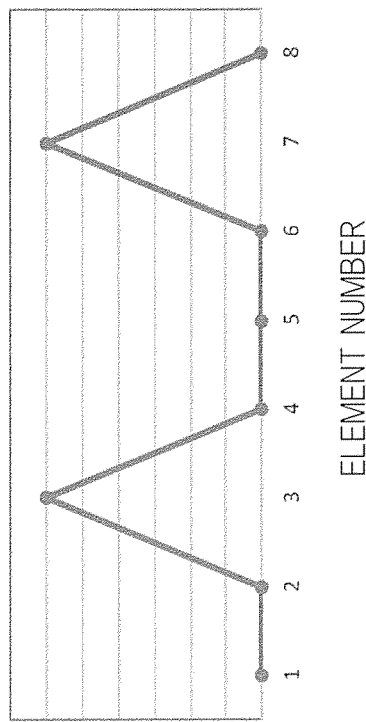
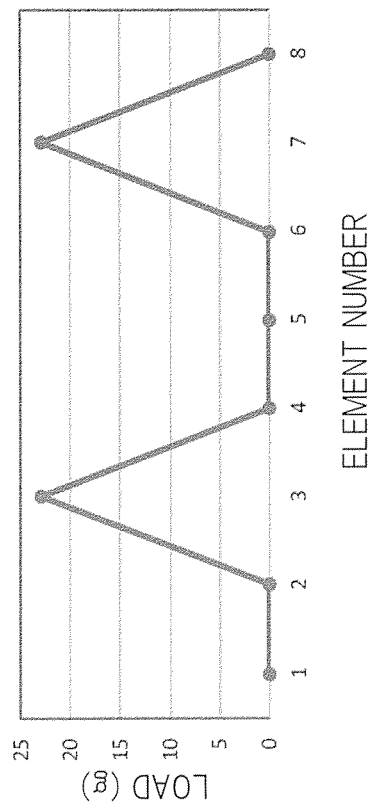
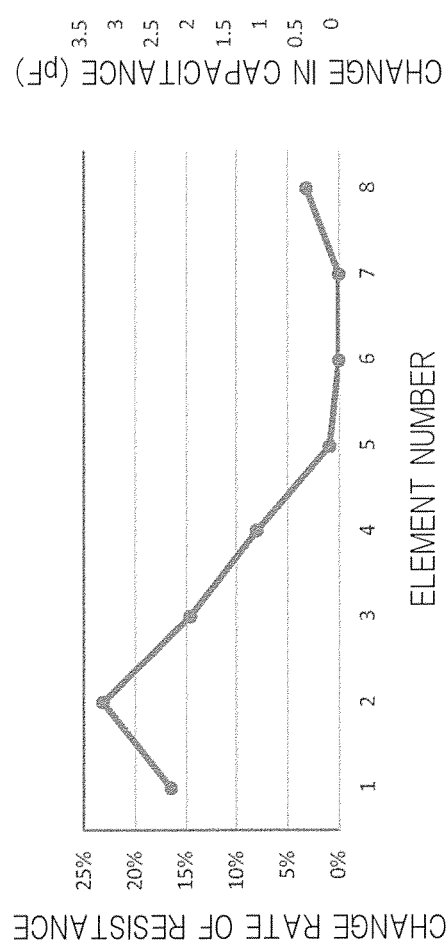
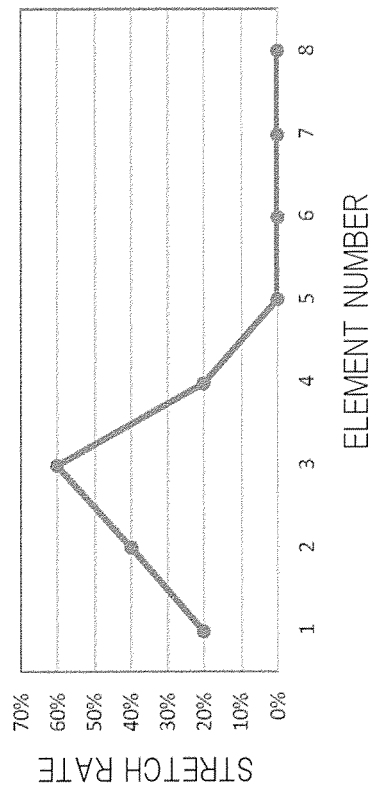

STRETCHABLE ELECTRICALLY-CONDUCTIVE CIRCUIT AND MANUFACTURING METHOD THEREFOR

CROSS-REFERENCE TO RELATED APPLICATIONS

This application is a National Stage application of International Patent Application No. PCT/JP2015/063943, filed on May 14, 2015, which claims priority to Japanese Patent Application Numbers 2014-102087, filed on May 16, 2014 and 2014-252330, filed on Dec. 12, 2014, each of which is hereby incorporated by reference in its entirety.

TECHNICAL FIELD

The present invention relates to a stretchable electrically-conductive circuit having excellent stretchability and bendability and a method for manufacturing the same.

BACKGROUND ART

Recently, demand for such a stretchable electrically-conductive circuit has been increased in various fields, for example, an antenna or a wire for RFID devices requiring flexibility, a wire for a motion analysis sensor in sports science, a wearable heartbeat/electrocardiogram monitor, a wire in a robot movable portion, and a wire for a finger sensor in order to transmit commands to a computer. Furthermore, the stretchable electrically-conductive circuit has been demanded as a wire for a bendable sensor attached to a finger, an elbow joint, and a knee joint in order to remotely control a robot.

WO 2009-102077 A (Japanese Patent Application No. 2009-553493) discloses a method for manufacturing an electrically-conductive rubber having stretchability by dispersing ionic liquids and carbon nanotubes in rubber.

Japanese Patent Application Laid-Open Publication No. 2013-187380 discloses a method for manufacturing a stretchable circuit substrate by sticking a copper wire having a wavelike structure on an elastomer.

Japanese Patent Application Laid-Open Publication No. 2011-34822 discloses a method of providing a wire including urethane rubber and silver powder to a lower surface of an elastomer sheet made from ester urethane rubber.

Japanese Patent Application Laid-Open Publication No. 2013-206080 discloses a method of providing an antenna for a booster including electrically-conductive fibers to an antenna of an IC chip such that the antenna for a booster is disposed to face each other in a state in which the antenna of the IC chip does not adhere to the antenna for the booster.

SUMMARY

WO 2009-102077 A (Japanese Patent Application No. 2009-553493) discloses a method for forming a stretchable electrical conductor by dispersing carbon nanotubes, metallic nanowires, and the like so as to achieve electrical conductivity. Although these materials are expensive, it is necessary to extremely enhance contents of these materials in order to obtain sufficient electrical conductivity. Accordingly, a final product becomes expensive, which prevents popularization of the stretchable electrical conductor in fields of sports science and medicine.

Meanwhile, Japanese Patent Application Laid-Open Publication No. 2013-187380 discloses that stretchability is realized by a structure of a metallic pattern itself such as a wavelike wire, and there are problems that a manufacturing process is complicated and a stretch rate is poor.

Japanese Patent Application Laid-Open Publication No. 2011-34822 discloses that silver powder is enclosed inside urethane rubber so as to manufacture a stretchable conducting wire individually, and there are problems that cost is high and flexibility is impaired. Also, a function as the conducting wire is impaired when an electrical contact among the silver powder is cut off in any positions.

As disclosed in Japanese Patent Application Laid-Open Publication No. 2013-206080, in a case of using electrically-conductive fibers, the electrically-conductive fibers themselves are expensive, and furthermore, it is necessary to cut out electrically-conductive fiber sheets when forming an antenna of various forms. Consequently, a large number of the electrically-conductive fiber sheets are wasted, which leads to a further cost increase and restriction on degree of freedom in bendable antenna forms.

Therefore, an object of the present invention is to provide a low-cost stretchable electrically-conductive circuit having excellent stretchability, bendability, durability, as well as used as a stretch sensor and capacitive pressure sensor, by adsorbing electrically-conductive fiber materials such as stretchable fibers, for example, nylon, whose surfaces are attached with silver by a vacuum evaporation to a front surface of a base material having both viscosity and stretchability, and to provide a manufacturing method therefor.

In order to solve the above-described problems, a stretchable electrically-conductive circuit according to the present invention includes: an elastomer sheet having an adhesive layer corresponding to a wiring region with a predetermined pattern formed on a front surface of the elastomer sheet; and electrically-conductive fiber materials each having a predetermined diameter and a predetermined length and attached to the adhesive layer and coming in contact with each other along the wiring region so as to have mutual electrical continuity, and the electrically-conductive fiber materials relatively move maintaining the mutual electrical continuity so as to maintain the mutual electrical continuity in the wiring region when the elastomer sheet is stretched or bended.

Also, a method for manufacturing a stretchable electrically-conductive circuit according to the present invention includes the steps of: forming an adhesive layer on a front surface of an elastomer sheet using a mask corresponding to a wiring region with a predetermined pattern; attaching electrically-conductive fiber materials on the adhesive layer; removing, among the electrically-conductive fiber materials, an electrically-conductive fiber material unable to be applied to the adhesive layer; and removing the mask after hardening the adhesive layer.

According to the present invention, electrically-conductive fiber materials each having a predetermined diameter and a predetermined length are attached to a front surface of an elastomer sheet adhesive layer corresponding to a wiring region with a predetermined pattern, and electrically-conductive fiber materials relatively move maintaining mutual electrical continuity so as to maintain the electrical continuity in the wiring region when the elastomer sheet is stretched or bended. Therefore, it is possible to achieve a low-cost stretchable electrically-conductive circuit having excellent stretchability, bendability, and durability without impairing flexibility of the elastomer sheet.

Furthermore, the stretchable electrically-conductive circuit can be used as a stretch amount sensor by making use of such an advantage that electrical continuity with respect to a stretch rate, that is, a characteristic of a change in resistance value can be variously adjusted by selecting fiber lengths and the like of the electrically-conductive fiber materials.

Furthermore, an elastomer sheet is interposed between attached layers of the electrically-conductive fiber materials in such a way that the attached layers of the electrically-conductive fiber materials are opposed to each other, and accordingly, capacitance between opposing electrodes is changed in accordance with pressure and load applied on a front surface of the elastomer sheet, so that the stretchable electrically-conductive circuit can be used as a pressure sensor.

BRIEF DESCRIPTIONS OF THE DRAWINGS

FIG. 1(a) is a schematic view illustrating an initial state of electrically-conductive fiber materials according to the present invention;

FIG. 1(b) is a schematic view illustrating a bending state of electrically-conductive fiber materials according to the present invention;

FIG. 1(c) is a schematic view illustrating a bending state of electrically-conductive fiber materials according to the present invention;

FIG. 2 is a view illustrating a relation between a stretch of an elastomer sheet and an increase in resistance value;

FIG. 7 is a view illustrating a stretchable electrically-conductive circuit of Example 4 to which a cable-like stretchable electrically-conductive circuit is applied;

FIG. 8 is a view illustrating measured values of a change in resistance value with respect to a stretch rate of the cable-like stretchable electrically-conductive circuit according to Example 4;

FIG. 23 is a view illustrating a relation between measured values of resistance values and capacitance and actual values of stretch amount and pressure.

DETAILED DESCRIPTION

Figure 3:
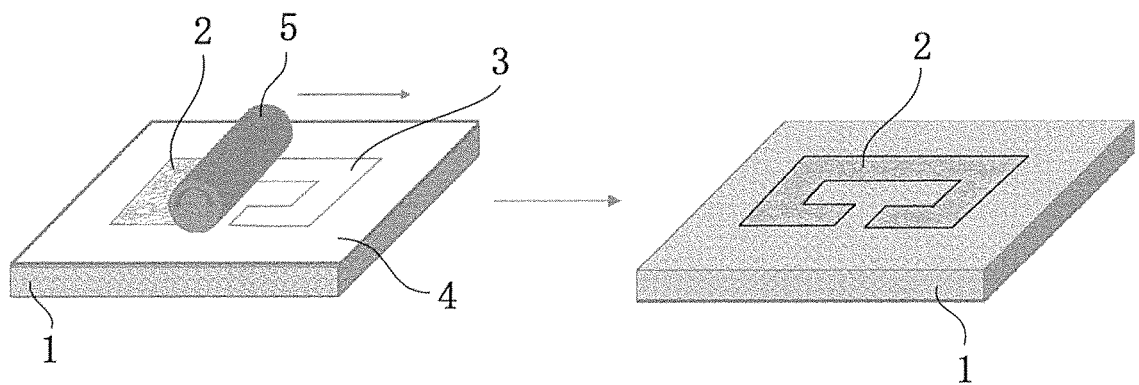
FIG. 3 is a view illustrating how to attach electrically-conductive fiber materials by a brush roller method.

First, a fundamental principle of the present invention will be described.

FIG. 1(a) is a schematic view illustrating an initial state of electrically-conductive fiber materials, and FIG. 1(b) and FIG. 1(c) are schematic views illustrating a bending state of electrically-conductive fiber materials.

In the present invention, an adhesive layer is formed on an elastomer sheet 1 including urethane elastomer and the like along a desired circuit wire. Electrically-conductive fiber materials 2 each having a predetermined length and a predetermined diameter are attached to the adhesive layer.

When the electrically-conductive fiber materials 2 reach the adhesive layer, at least a part of a tip portion or a middle portion of the electrically-conductive fiber materials 2 is buried in the adhesive layer. When a front surface of the adhesive layer is slightly pressed with a roller or when the front surface is coated with a film and the like, exposed part falls over the front surface of the adhesive layer and intersects with each other to be electrically connected. Accordingly, as the initial state illustrated in FIG. 1(a), electrical continuity is secured through the whole area between both ends of the circuit wire in a longitudinal direction.

Note that, in the drawings, closed circles indicate connecting points of the electrically-conductive fiber materials 2 and arrows indicate flows of electric currents in which an upper left electrically-conductive fiber material 2 is regarded as a starting point.

When the elastomer sheet 1 is stretched or bended, the respective electrically-conductive fiber materials 2 relatively move maintaining intersection with the other electrically-conductive fiber materials 2 on the front surface of the adhesive layer as a state 1 illustrated in FIG. 1(b), so that electrical continuity securely can be maintained without affecting flexibility of the elastomer sheet 1.

However, when the elastomer sheet 1 is extremely stretched as a state 2 illustrated in FIG. 1(c), the electrical connection is cut off between partial electrically-conductive fiber materials 2. Furthermore, a length of the electrically-conductive fiber materials 2 electrically connecting to each other is increased, which leads to an increase in resistance value.

A relation between the stretch of the elastomer sheet and the increase in resistance value is illustrated in FIG. 2.

A lower straight line represents an ideal state in which all the electrical connections of the respective electrically-conductive fiber materials are maintained regardless of a stretch amount of the elastomer sheet. Basically, a resistance value increases in proportion to a distance between both ends of the electrically-conductive fiber materials accompanying the stretch of the elastomer sheet.

In contrast, when the a stretch mount of the elastomer sheet reaches a degree of value, detachment between the electrically-conductive fiber materials occurs, an amount of the detachment drastically increases in accordance with the stretch, the elastomer sheet transits from the state 1 to the state 2, and along with this transition, the resistance value drastically increases.

Hereinafter, consideration is given to a quality, a length, a diameter of each electrically-conductive fiber material and a relation between an arrangement of the electrically-conductive fiber materials in the adhesive layer and a characteristic of increase in resistance as illustrated in FIG. 2.

(1) Quality of Electrically-Conductive Fiber Material

As described above, since the electrically-conductive fiber materials relatively move maintaining intersection with the other electrically-conductive fiber materials on the front surface of the adhesive layer, it is preferable that a quality of the electrically-conductive fiber material has high flexibility in order to maintain electrical connection between the electrically-conductive fiber materials even when the elastomer sheet is largely stretched or bended.

In a case where the elastomer sheet is expected to be bended largely, a silver-coated fiber in which a front surface of a nylon fiber is coated with silver can be considered as a preferable example.

Furthermore, a fiber material obtained by polymerizing an electrically-conductive polypyrrole polymer to a front surface of a fiber and by integrating with a fiber of a base material also has a thin electrically-conductive polymer layer having a thickness of 0.01 to 0.05 μm on its front surface, which is therefore preferable as the electrically-conductive fiber material which does not impair characteristics of the fiber material.

Conversely, in a case of mounting the elastomer sheet to a portion stretched or bended not so largely, a metal staple fiber obtained by cutting a fine wire of copper or aluminum to a predetermined length can be applied as the electrically-conductive fiber material.

(2) Length of Electrically-Conductive Fiber Material

The longer the electrically-conductive fiber material, the longer the length from an intersection portion between adjacent electrically-conductive fiber materials can be secured. Therefore, even when the stretch amount of the elastomer sheet increases, the electrical connection between the adjacent electrically-conductive fiber materials is hardly cut off, so that increase in resistance value can be reduced.

However, when the electrically-conductive fiber material is too long, a portion not coming in contact with the adhesive layer increases, which causes the electrically-conductive fiber material to be easily detached from the adhesive layer. Therefore, an optimum length is selected taking into consideration a bending rate of the elastomer sheet and the like.

(3) Diameter of Electrically-Conductive Fiber Material

When the diameter of each electrically-conductive fiber material is enlarged, electric resistance per one material can be decreased, but rigidity increases, and accordingly, electrical contact between other adjacent electrically-conductive fiber materials cannot be conducted smoothly.

As described later, in a case where a material in which fibers such as nylon are coated with a metal having excellent electrical conductivity such as silver is used as the electrically-conductive fiber material, electric resistance is determined based on a front surface area of the electrically-conductive fiber material. Therefore, it is not always possible to obtain a desired electric resistance with respect to a total amount of the attached electrically-conductive fiber material. Therefore, an optimum diameter is selected taking into consideration characteristics of the electrically-conductive fiber material to be used, a rate of change in electric resistance accompanying bending of the elastomer sheet.

(4) Arrangement of Electrically-Conductive Fiber Material in Adhesive Layer

When attaching the electrically-conductive fiber materials on the adhesive layer, a brush roller method or a spray method is applicable.

In regard to the brush roller method, as illustrated in FIG. 3, on the elastomer sheet 1 having the adhesive layer on the front surface thereof, a mask 4 corresponding to a circuit wire 3 is disposed, and after an adhesive is applied to form the adhesive layer, the electrically-conductive fiber materials 2 are then buried into the adhesive layer by a rotation brush 5. As a result, the electrically-conductive fiber materials 2 can be oriented to some extent. Even when the elastomer sheet 1 is largely stretched in the longitudinal direction, it is possible to maintain electrical contact between the electrically-conductive fiber materials 2.

However, with respect to stretch of the elastomer sheet 1 in a width direction, there is a possibility that electrically-conductive resistance is deteriorated due to a shortage of the electrically-conductive fiber materials 2 intersecting in the width direction on the front surface of the adhesive layer.

Note that, on the elastomer sheet 1 in which a hardened adhesive layer is formed on the whole surface thereof, a mask 4 composed of a material having high detachability may be disposed, the electrically-conductive fiber materials 2 may be buried in the adhesive layer with the rotation brush 5, and then, the mask 4 may be detached from the adhesive layer.

Figure 4:
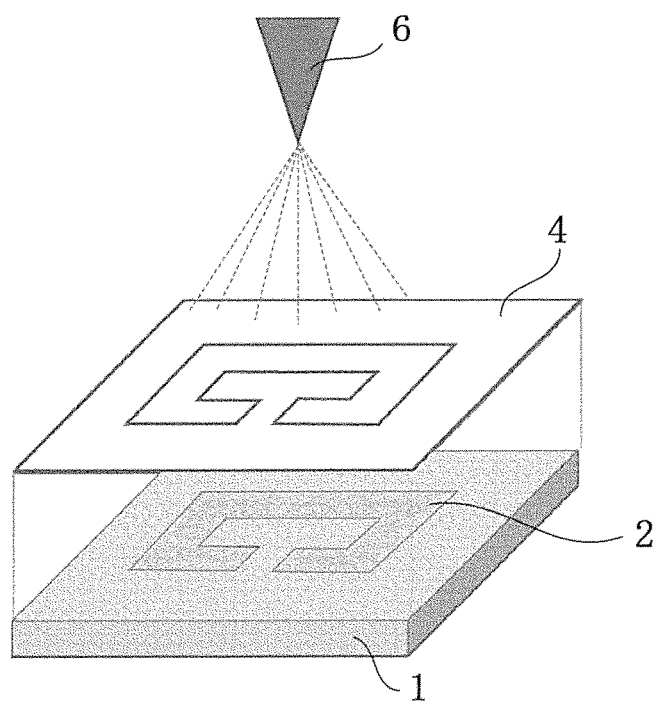
FIG. 4 is a view illustrating how to attach the electrically-conductive fiber materials by a spray method.

Meanwhile, in regard to the spray method, the electrically-conductive fiber materials 2 are sprayed to the adhesive layer from above the mask 4 corresponding to the circuit wire 3 by a spray 6 with high pressure as illustrated in FIG. 4. In this method, random arrangement can be obtained.

In either case, the electrically-conductive fiber materials 2 are supplied and excessively attached to the adhesive layer until exceeding a saturated state where the electrically-conductive fiber materials 2 can be attached to the adhesive layer. Then, excess electrically-conductive fiber materials 2 are removed by compressed air to form a circuit wire.

Figure 5:
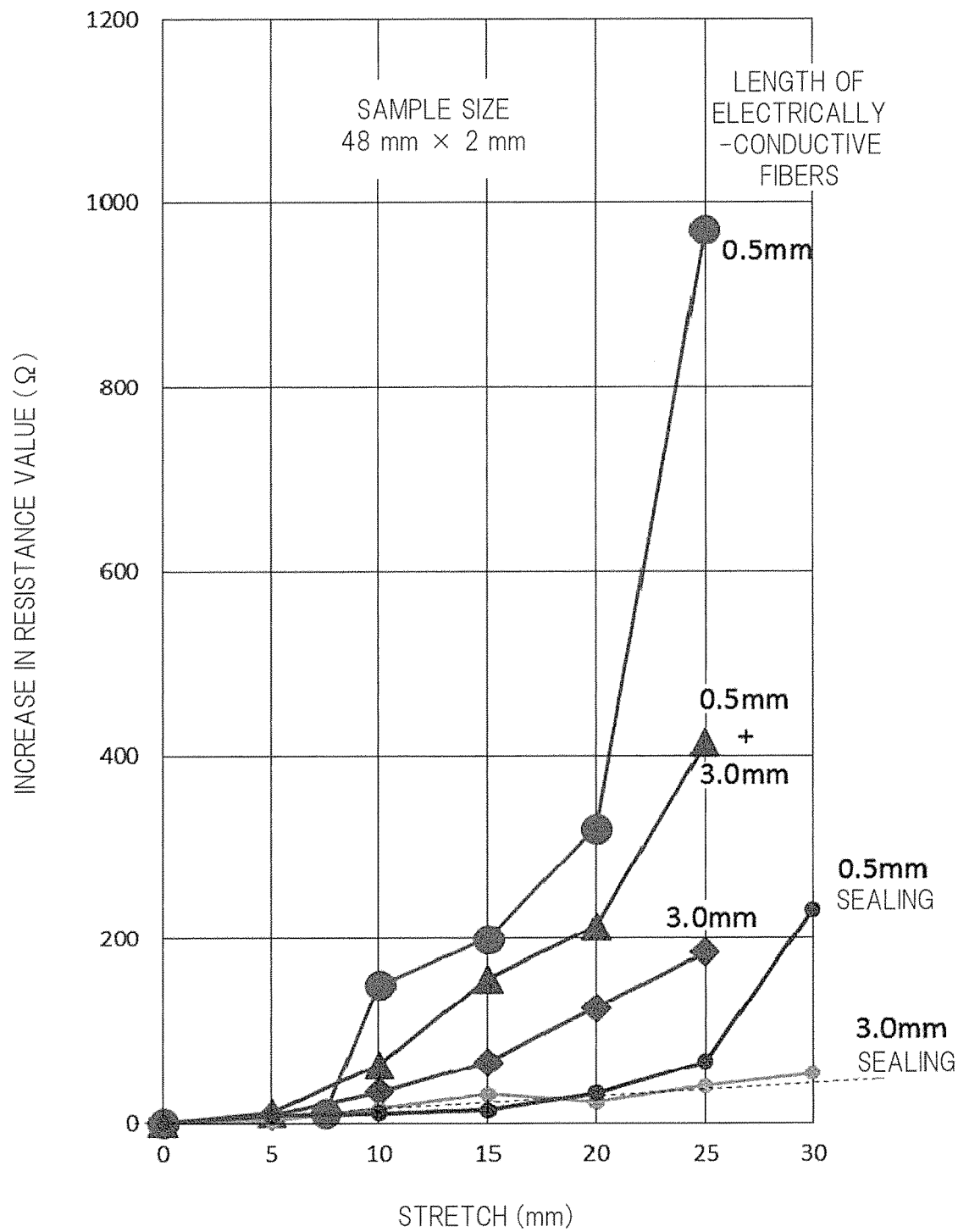
FIG. 5 is a view illustrating a relation between a length of silver-coated fibers, a stretch of a stretchable elastomer sheet, and an increase in resistance.

Herein, in a case where silver-coated fibers (diameter of 17.6 μm) having nylon coated with silver are used as the electrically-conductive fiber materials and where the electrically-conductive circuit wire of the present invention is formed on an elastomer sheet having a sample size of 48 mm×2 mm, each length of the silver-coated fibers and actual measured values of a change in resistance value accompanying the stretch are illustrated in FIG. 5.

Note that "sealing" in the drawing represents an aspect in which the silver-coated fibers attached to the adhesive layer are sealed with a similar elastomer sheet or a coated layer formed of a thin film and the like having flexibility equivalent to or more than the elastomer sheet and front surfaces of the silver-coated fibers attached to the adhesive layer is pressed.

As for maximum stretch amounts, each graph represents [silver-coated fiber of 3.0 mm with sealing], [silver-coated fiber of 0.5 mm with sealing], [3.0 mm, no sealing], [mixture of silver-coated fibers of 0.5 mm and of 3.0 mm, no sealing], and [silver-coated fiber 0.5 mm, no sealing] in the order from one having smaller increase in resistance value.

As seen from the actual measured results, in a case of sealing an upper surface with the silver-coated fibers each having a diameter of 17.6 μm and a length of 3 mm as the electrically-conductive fiber materials, the resistance value is hardly increased even at the maximum stretch amount of 30 mm. This represents that the silver-coated fibers have a sufficient length in the upper surface of the adhesive layer even when stretched to the maximum stretch amount. In addition, this represents that the electrical connection between the silver-coated fibers is mostly maintained since the upper surface is pressed by the elastomer sheet or thin film.

In contrast, even in a case of using short silver-coated fibers each having a diameter of 17.6 μm and a length of 0.6 mm, when the upper surface is pressed by the elastomer sheet or thin film, it is possible to suppress increase in resistance value to a minimum as long as the stretch amount is up to 25 mm.

Coating the upper surface with use of the elastomer sheet or thin film causes a cost increase or deterioration of flexibility. However, a length and a combination of the silver-coated fibers, and presence or absence of the upper surface coated layer may be selected in accordance with uses, for example, a degree of stretch generated when the elastomer sheet or thin film is used.

Meanwhile, for example, it is found that, in a case of using [silver-coated fiber of 0.5 mm, no sealing], increase in resistance with respect to the stretch is large, and except for a case of using [silver-coated fiber of 3.0 mm, with sealing], increase in resistance becomes large with respect to the stretch on a one-to-one relation.

By taking advantage of this characteristic, it is possible to measure the stretch amount based on change in resistance value by using a stretchable electrically-conductive sheet using the electrically-conductive fiber materials 2 according to the present invention.

Furthermore, by laminating stretchable electrically-conductive sheets, it is possible to allow an elastomer sheet located between the electrically-conductive fiber materials to function as a capacitor, and it is also possible to use as a pressure sensor by measuring capacitance accompanying a change in gap between the electrically-conductive fiber materials in accordance with a front surface pressure of the stretchable electrically-conductive sheet.

EXAMPLES

Hereinafter, specific examples will be described with reference to the drawings.

Example 1

Figure 6:
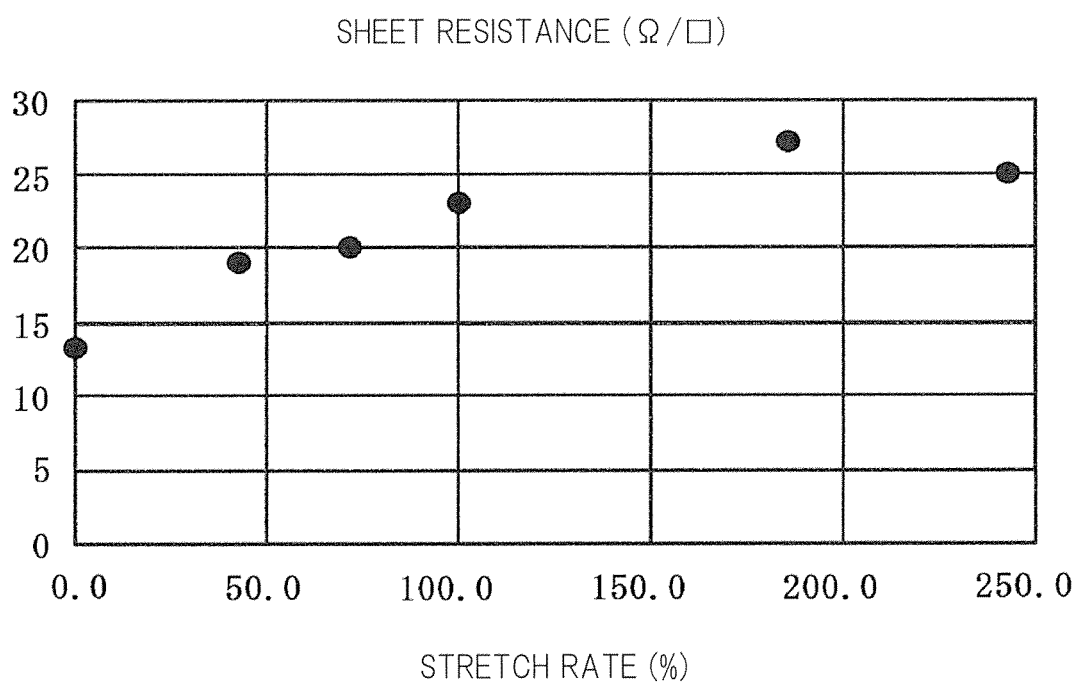
FIG. 6 is a view illustrating actual measured values of a stretch rate and a sheet resistance of Example 1.

An adhesive layer was applied to the whole surface of an elastomer sheet (for example, a urethane elastomer sheet having a size of 3 cm×8 cm and a thickness of 1 mm) having predetermined flexibility. With viscosity appearing on the adhesive layer to some extent, silver-plated nylon fibers each having a length of 0.5 mm to 3 mm and a diameter of 17.6 μm were attached to the adhesive layer as the electrically-conductive fiber materials by the brush roller method. Sheet resistance of the stretchable electrically-conductive sheet was measured by a resistance meter. Actual measured results are indicated in FIG. 6.

There was a small change in sheet resistance up to a 250% stretch rate, which indicated a preferable characteristic.

Example 2

Silver-plated nylon fibers (a fiber length of 0.3 mm to 3 mm, a fiber diameter of 17.6 μm) were adsorbed to an adhesive layer of an elastomer adhesive sheet (a size of 3 cm×8 cm, a thickness of 1 mm) by the brush roller spray method. The electrically-conductive sheet was brought into contact with an LED lighting circuit wire, and luminance of the LED was visually observed when a stretch rate was approximately 100%. Comparing to a case when the stretch rate was 0%, change in luminance was not observed.

Example 3

An antenna pattern for UHF-RFID was formed by forming a mask in which PET was cut on an adhesive layer of an elastomer adhesive sheet (a size of 3 cm×9 cm, a thickness of 1 mm) and by adsorbing silver-plated nylon fibers (a fiber length of 0.3 mm to 3 mm, a fiber diameter of 17.6 μm) to the mask by the brush roller method. The antenna pattern was mounted with an IC chip for RFID conforming to EPC global gen2 to form a stretchable RFID tag. Attaching the stretchable RFID tag to clothing, a readout experiment was carried out by an RFID readout device (BHT-604QUWB made by DENSO WAVE Inc., at an output of 10 mW).

The ID could be read out within a communication distance of approximately 3 cm. Even when a stretch rate reached approximately 100%, the communication distance could be maintained within approximately 2.5 cm.

Note that, in Examples 1 to 3, there were no big differences among the experimental results even in a case of sticking the silver-plated nylon fibers by the spray method.

Example 4

As illustrated in FIG. 7, in regard to an elastomer sheet (for example, a urethane elastomer sheet having a size of 20 cm×10 cm, a thickness of 40 μm) having predetermined flexibility and including an adhesive layer applied to one surface thereof, with viscosity to some extent appearing on the adhesive layer of one surface of the elastomer sheet, silver-plated nylon fibers each having a length of 0.5 mm to 3 mm and a diameter of 17.6 μm were attached in a width of 5 cm and a length of 15 cm in a length direction of the elastomer sheet to the elastomer sheet by the brush roller method.

In the present Example, a width of the elastomer sheet was made larger than a width of a layer to which the silver-plated nylon fibers were stuck (hereinafter, referred to as a "wire width W".), and after being stuck, the elastomer sheet was rolled so as to make a cable-like stretchable wire of which a cross-section was in a circular shape.

FIG. 8 indicates results obtained by measuring a change in resistance with respect to the stretch of the stretchable wire by the resistance meter. It was possible to obtain an excellent cable-like stretchable wire in which a resistance value was hardly changed even with respect to a 100% stretch rate (double stretch).

Example 5

Examples 1 to 4 relate to a stretchable electrically-conductive sheet or a cable-like stretchable wire in which change in resistance value is restrained as much as possible with respect to stretch, and Example 5 relates to a stretch amount detection sensor in which a resistance value with respect to a stretch amount is used positively.

Figure 9:
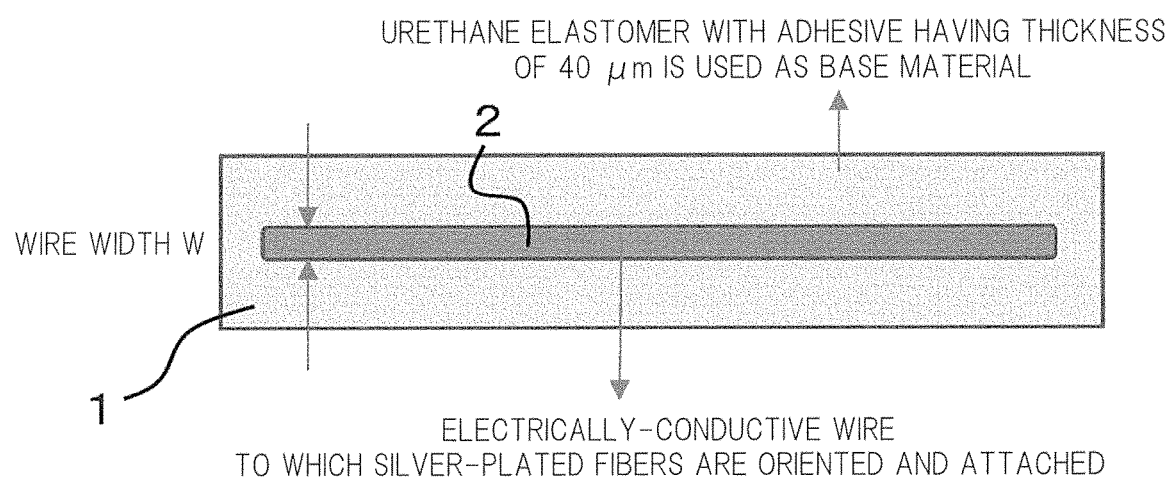
FIG. 9 is a view illustrating a stretchable electrically-conductive circuit of Example 5 used as a stretch amount detection sensor.

In FIG. 9, similarly to the above-described Example, a urethane elastomer with an adhesive and having a thickness of 40 µm was used as a base material, and silver-plated nylon fibers each having a length of 0.5 mm to 3 mm and a diameter of 17.6 µm were stuck in a saturated state to a wire width W to which the electrically-conductive fiber materials were attached.

Figure 10:
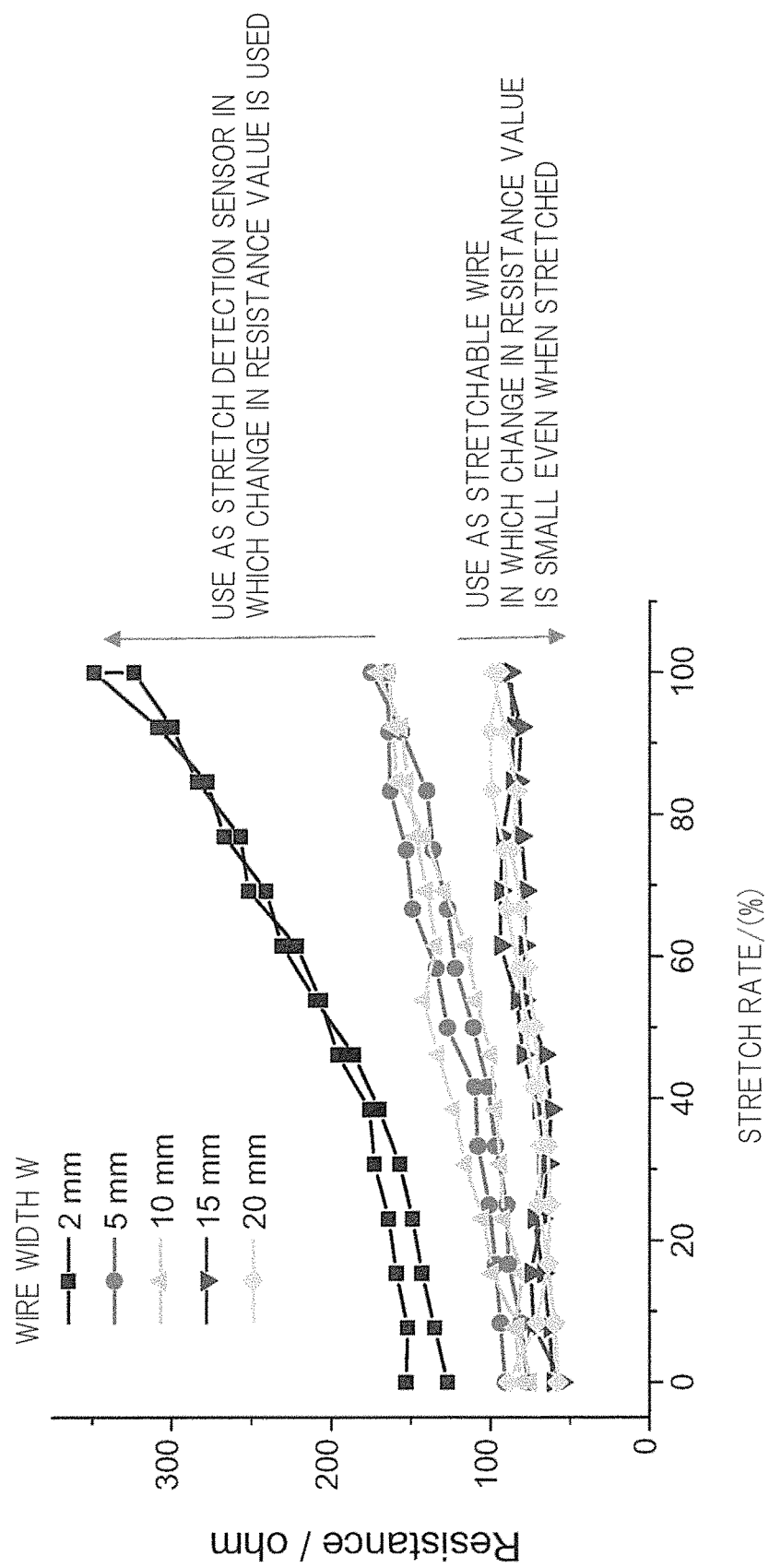
FIG. 10 is a view illustrating measured values of a change in resistance value with respect to a stretch rate when changing a wire width W in Example 5.

FIG. 10 indicates measured results in regard to change in resistance value with respect to stretch rate when changing W.

In regard to a wire width of 5 mm to 20 mm, there was a small change in resistance value with respect to the stretch rate, which indicated an excellent characteristic as the stretchable electrically-conductive circuit. However, when the wire width was 2 mm, it can be confirmed that the resistance value with respect to the stretch rate increased substantially linearly. This phenomenon is also similar in a case where fiber lengths of the respective silver-plated nylon fibers were shortened.

Taking advantage of such a characteristic, by variably selecting a length, a diameter, and a wire width W of each silver-plated nylon fiber, it is possible to use as the stretch amount sensor if a resistance value and a stretch amount are mapped in advance.

Example 6

In the present Example, the stretchable electrically-conductive circuits according to the present invention intersect with each other, in an intersection portion, opposing, attached electrically-conductive fiber materials function as opposing electrodes, and elastomer sheets present between the opposing electrodes function as electricity storage units (capacitors), so that the stretchable electrically-conductive circuits can be used as a stretchable capacitive pressure sensor.

Figure 11:
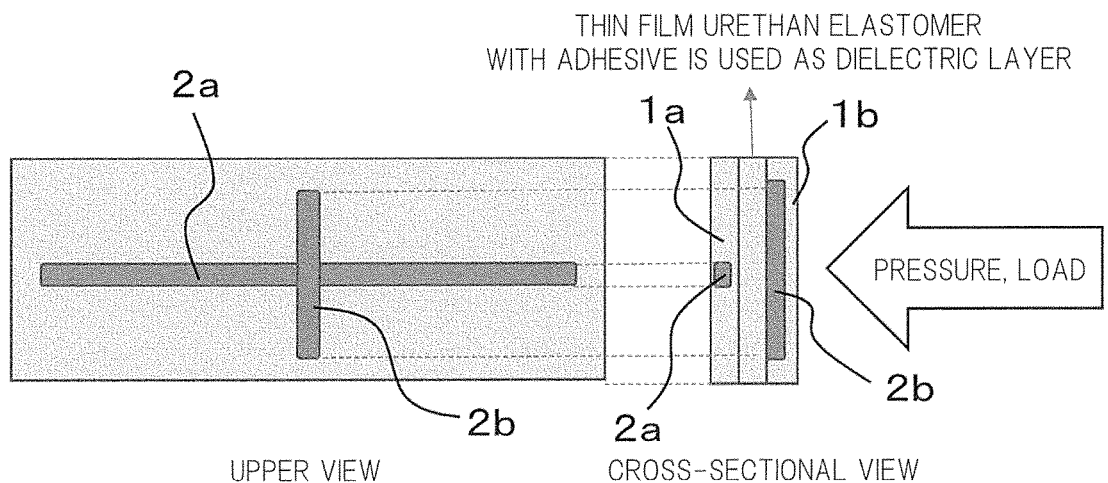
FIG. 11 is a view illustrating stretchable electrically-conductive circuits of Example 6 used as a capacitive pressure sensor.

Specifically, as illustrated in FIG. 11, an elastomer sheet 1a in which an electrically-conductive fiber material attached layer 2a extends in a horizontal direction and an elastomer sheet 1b in which an electrically-conductive fiber material attached layer 2b extends in a perpendicular direction are overlapped and attached to each other, so that the elastomer sheets 1a and 1b present in an intersection portion 7 of the electrically-conductive fiber material attached layers 2a and 2b function as the capacitors which stores electrons.

When pressure or load in the perpendicular direction is applied to front surfaces of the elastomer sheets 1a and 1b, the elastomer sheets 1a and 1b contract in the intersection portion 7, and a distance between the electrically-conductive fiber material attached layers 2a and 2b functioning as the opposing electrodes decreases, which increases the capacitance.

Figure 12:
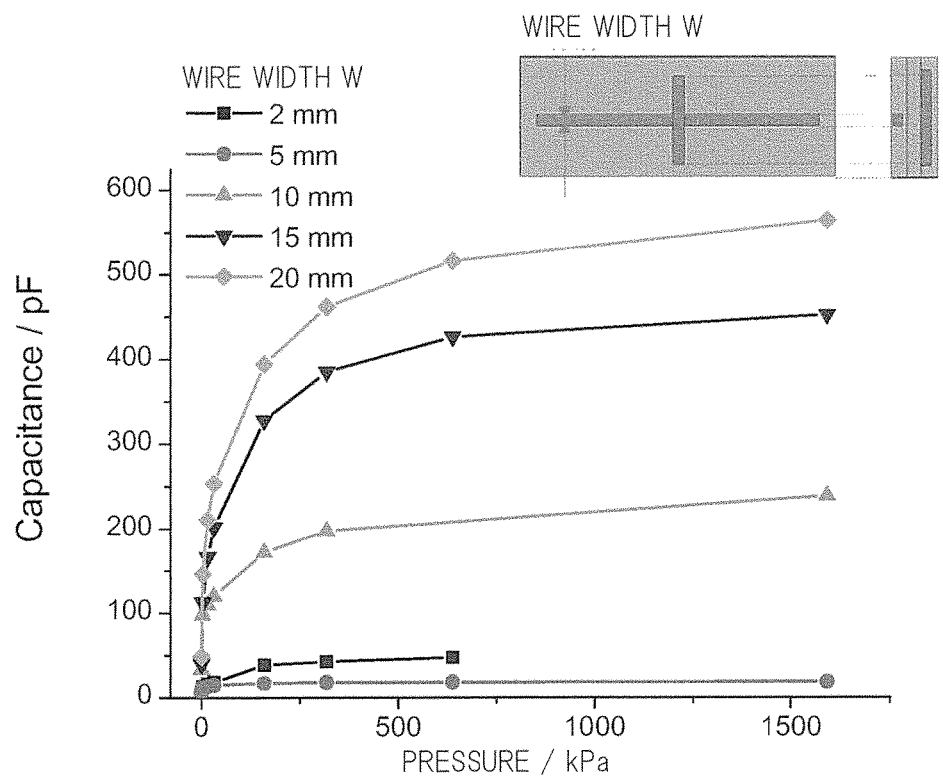
FIG. 12 is a view illustrating a change in capacitance with respect to pressure when changing the wire width W.

FIG. 12 illustrates measured results in regard to a change in capacitance with respect to an increase in pressure when the wire widths W of the electrically-conductive fiber material attached layers 2a and 2b intersecting with each other in the perpendicular direction were set to be from 2 mm to 20 mm. It is found that, the larger the wire widths W are set to be, the larger the capacitance increases till reaching high pressure.

Figure 13:
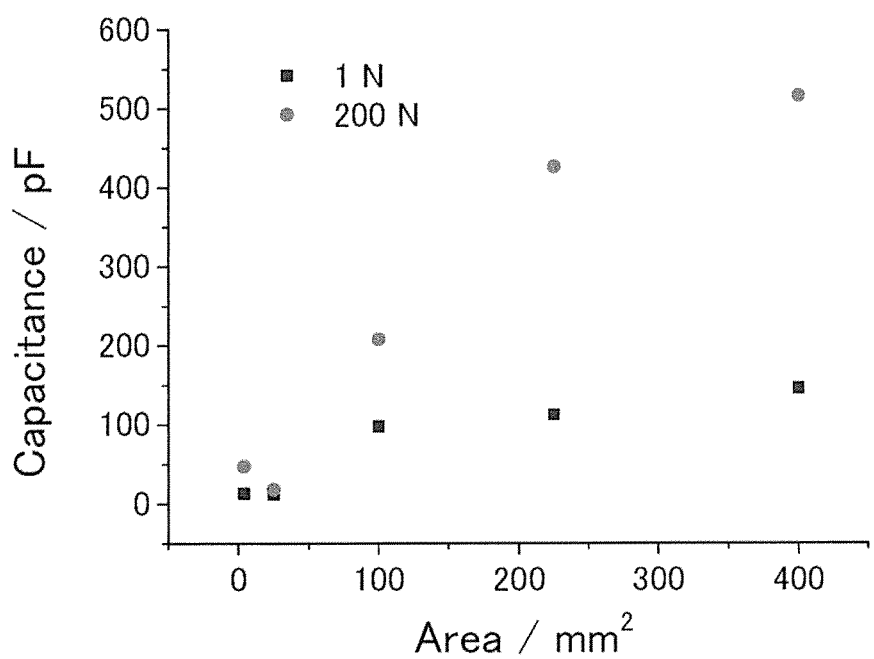
FIG. 13 is a view illustrating a relation between capacitance and an area of an element formed in an intersection portion in Example 6.

FIG. 13 illustrates measured results in regard to a change in capacitance with respect to an overlapping area when pressure was set to be 1 N (square) and 200 N (circle), the overlapping area of the electrically-conductive fiber material attached layers 2a and 2b is taken along an axis of the abscissas, and the capacitance is taken along an axis of the ordinate. In a case of applying the pressure of 200 N, the capacitance and the overlapping area are in a substantially direct proportional relation. By increasing the wire widths W of the electrically-conductive fiber material attached layers 2a and 2b, it is found that accurate measurement of the pressure is possible.

FIG. 13 illustrates measured results in regard to a change in capacitance with respect to an overlapping area when pressure was set to be 1 N (square) and 200 N (circle), the overlapping area of the electrically-conductive fiber material attached layers 2a and 2b is taken along an axis of the abscissas, and the capacitance is taken along an axis of the ordinate. In a case of applying the pressure of 200 N, the capacitance and the overlapping area are in a substantially direct proportional relation. By increasing the wire widths W of the electrically-conductive fiber material attached layers 2a and 2b, it is found that accurate measurement of the pressure is possible.

Figure 14:
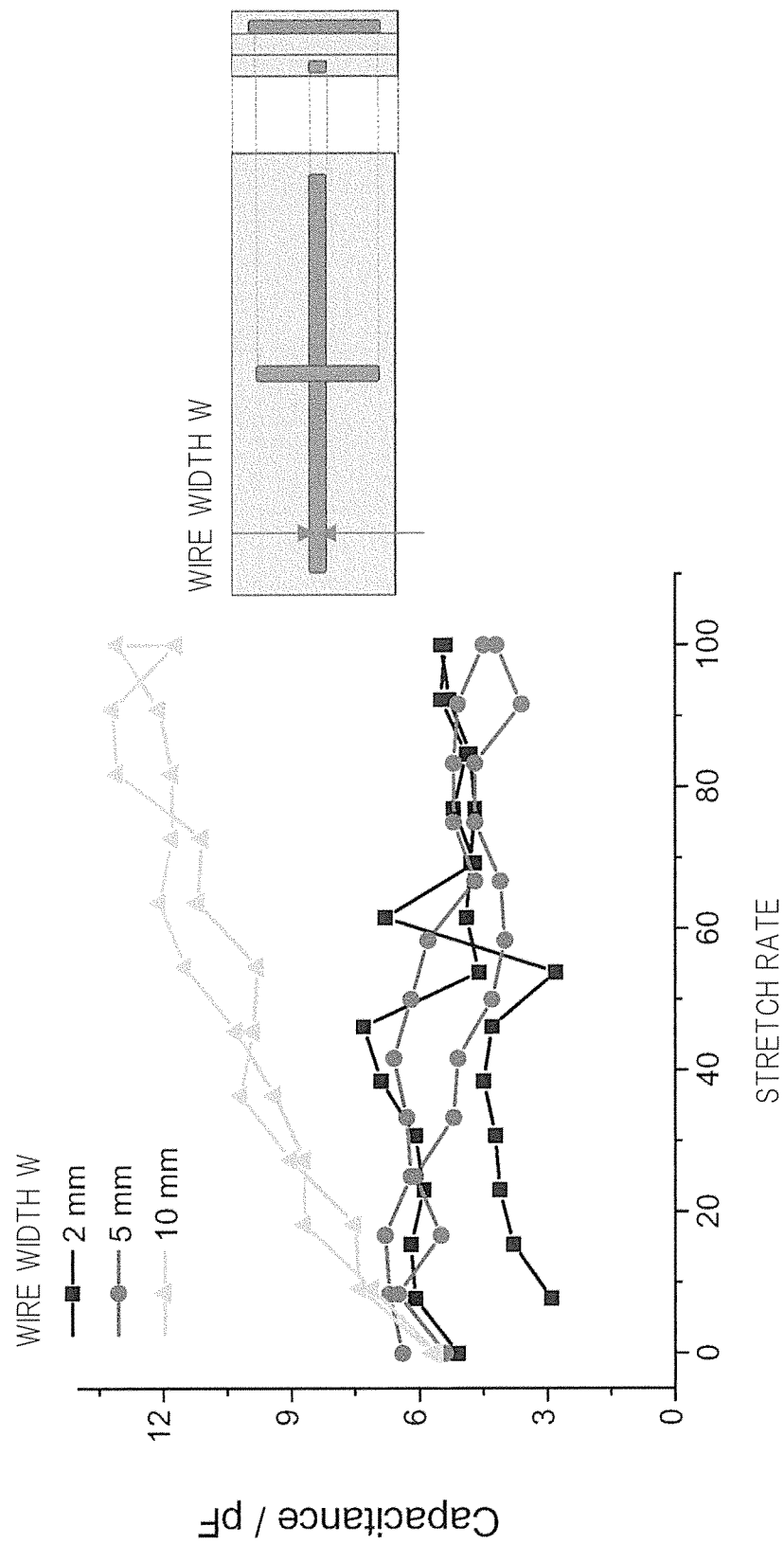
FIG. 14 is a view illustrating measured values of a change in capacitance with respect to a stretch in a horizontal direction.

Meanwhile, FIG. 14 illustrates measured results in regard to a change in capacitance when the wire widths W were set to be 2 mm, 5 mm, and 10 mm and when stress in the horizontal direction was applied to the front surfaces of the elastomer sheets 1a and 1b, so that the elastomer sheets 1a and 1b were stretched.

Specifically, when the wire widths W were set to be 2 mm and 5 mm, the capacitance with respect to a stretch rate is hardly changed. The elastomer sheets 1a and 1b contract and the capacitance increases due to the stretch, but the area of the overlapping portion also decreases along with the contraction, so that it can be considered that they offset each other.

Therefore, the stretchable capacitive pressure sensor of the present Example can accurately detect the pressure or load applied in the perpendicular direction by selecting the wire width W regardless of the stretch in the horizontal direction.

In the present Example, various modifications are applicable.

Figure 15:
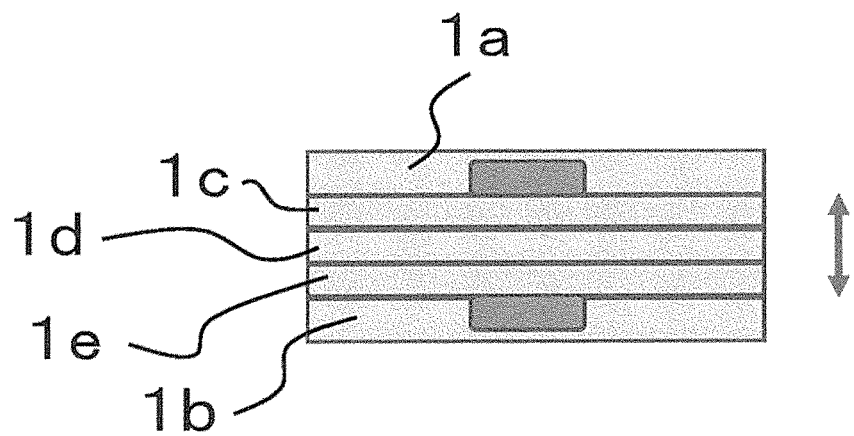
FIG. 15 is a view illustrating an example in which elastomer sheets are interposed as intermediate layers.

FIG. 15 illustrates an example of widening an interelectrode gap by interposing, between the elastomer sheets 1a and 1b, elastomer sheets 1c and 1d without electrically-conductive fiber material attached layer and having a predetermined thickness.

Figure 16:
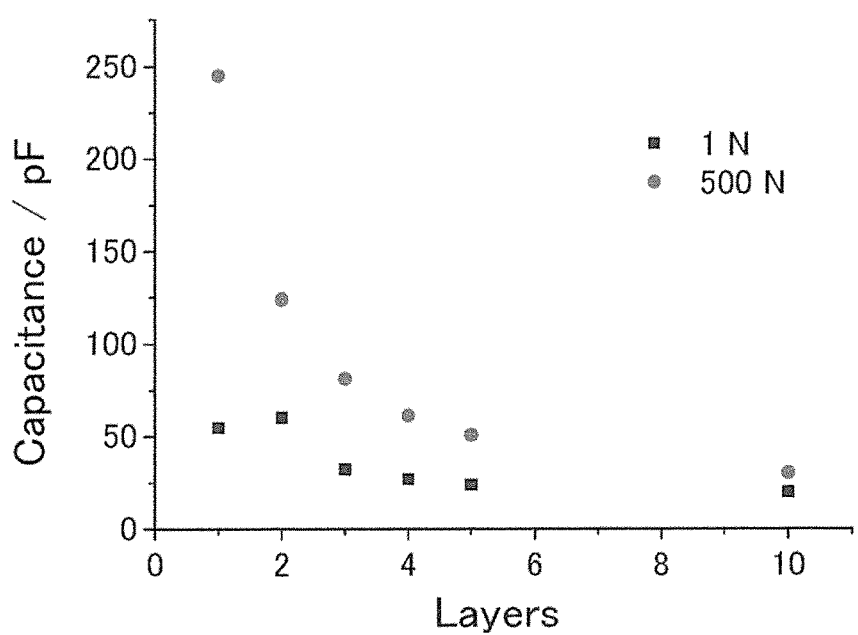
FIG. 16 is a view illustrating a change in capacitance and a change in number of the elastomer sheets serving as the intermediate layers.

FIG. 16 illustrates a change in capacitance with respect to the elastomer sheets to be interposed when applying a pressure of 500 N to the stretchable electrically-conductive circuits.

Figure 17:
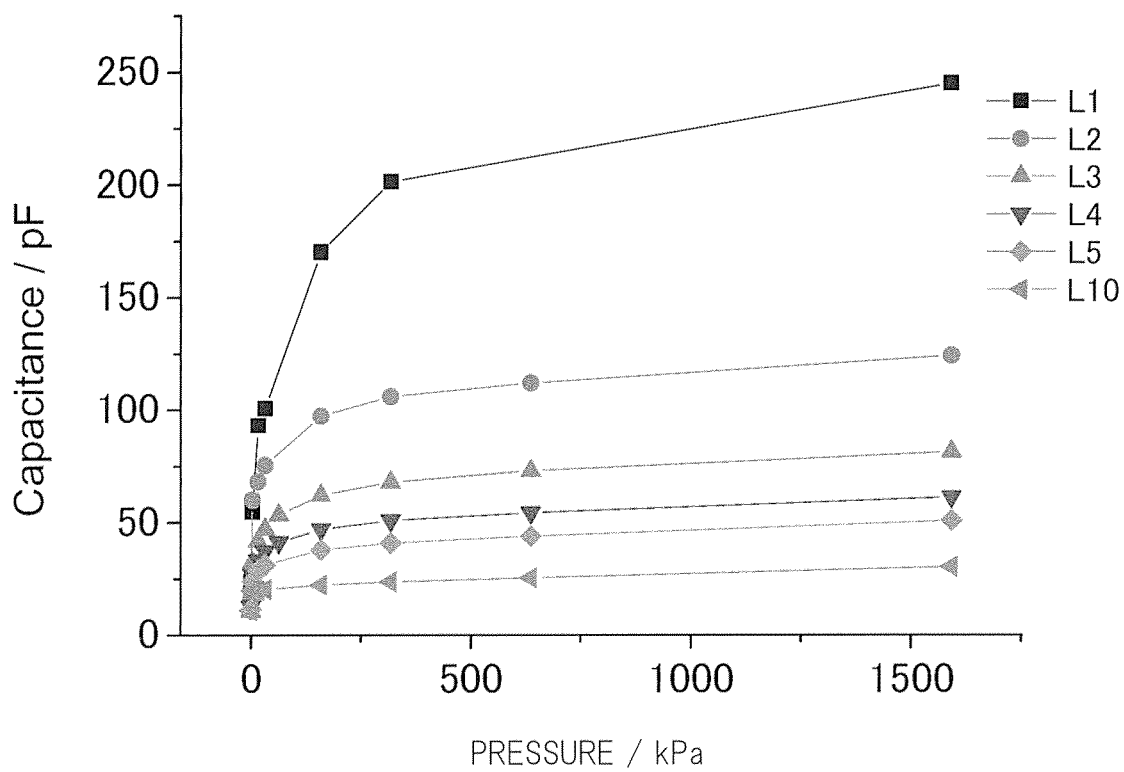
FIG. 17 is a view illustrating a change in capacitance with respect to pressure when the number of the elastomer sheets serving as the intermediate layers is increased.

FIG. 17 illustrates a change in capacitance with respect to a change in pressure and a change in load in a case of increasing the electrode gap due to the interposed elastomer sheets in order from L1 (first layer) to L10 (tenth layer).

In such manners, a small number of layers of the elastomer sheet can enhance sensitivity with respect to a small change in pressure and a small change in load. In contrast, when the layers of the elastomer sheet are increased, in a case where pressure and load are small, capacitance decreases in accordance with increase of the electrode gap, but an amount of contraction with respect to change in pressure of the interposed elastomer sheet increases, and accordingly, change in capacitance can be measured in a wide range.

Figure 18:
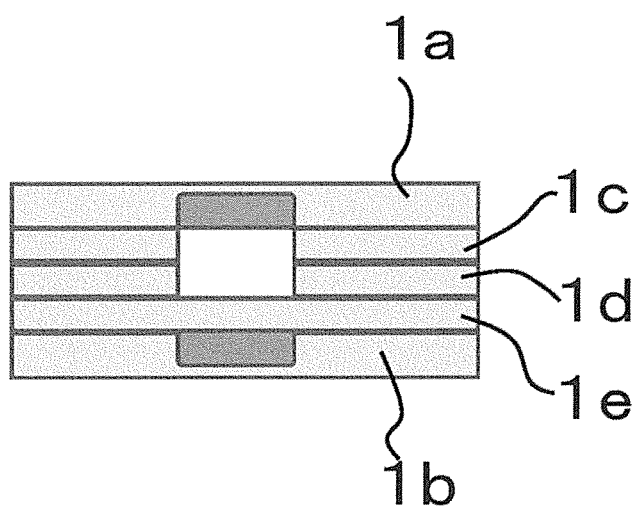
FIG. 18 is a view illustrating a modification example in which an opening is provided in the elastomer sheets serving as the intermediate layers.
Figure 19:
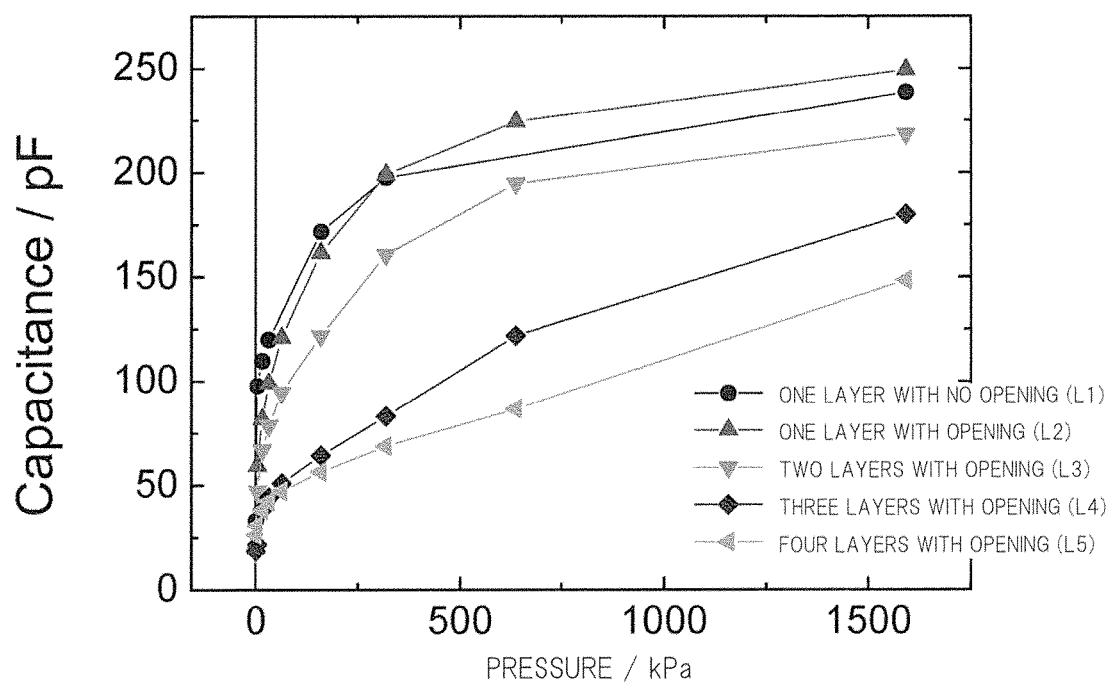
FIG. 19 is a view illustrating a change in capacitance with respect to pressure when the number of the intermediate layers in which the opening is formed is increased.

FIG. 18 illustrates an example in which the elastomer sheets 1c to 1e to be interposed are provided with an opening corresponding to a portion where the electrically-conductive fiber material attached layers 2a and 2b overlap. FIG. 19 illustrates measured results of a change in capacitance with respect to the pressure in a case of laminating the elastomer sheets from one layer with no opening (L1) to four layers with the opening (L5) sequentially.

Although L2 to which one layer of the elastomer sheet with the opening was added indicates the highest sensitivity, by increasing the number of the elastomer sheets with the opening sequentially, a linear characteristic becomes favorable, and accordingly, it is found that it is possible to enhance accuracy and also to measure in ranges of much higher pressure and load.

Example 7

In the present Example, with respect to a first stretchable electrically-conductive circuit in which the stretchable electrically-conductive circuit according to the present invention is used as the stretch detection sensor, a second stretchable electrically-conductive circuit intersecting with the first stretchable electrically-conductive circuit is used as a stretchable capacitive pressure sensor, so that it is possible to measure pressure, load, and stretch simultaneously.

Figure 20:
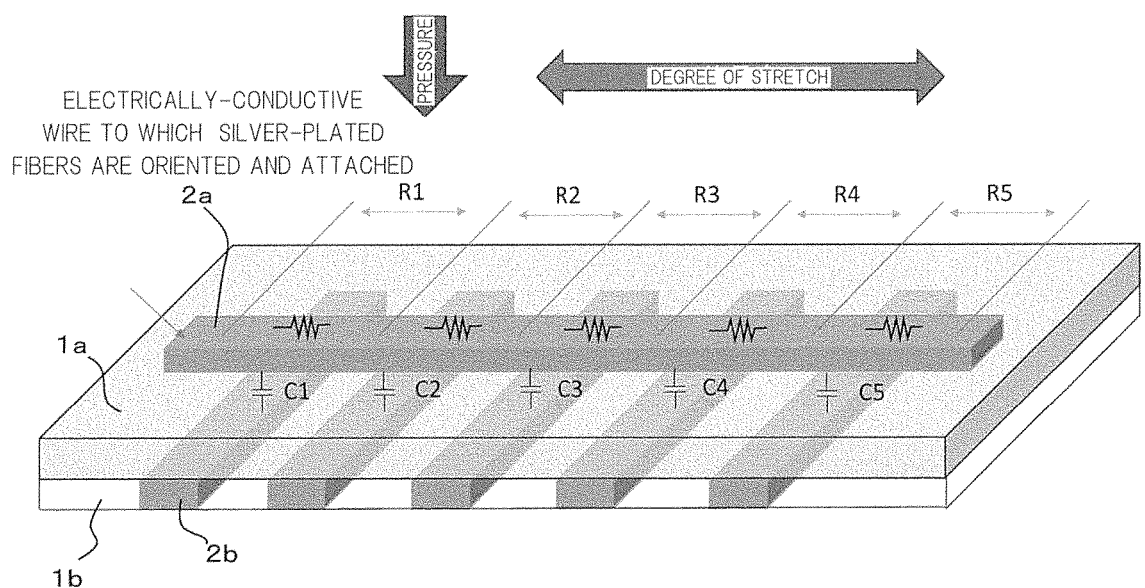
FIG. 20 illustrates Example 7 in which one electrically-conductive fiber attached layer formed on one elastomer sheet and five electrically-conductive fiber attached layers formed on the other elastomer sheet intersect at five points, where one elastomer sheet serves as a stretch detection sensor and the other serves as a pressure sensor.

As illustrated in FIG. 20, an elastomer sheet 1a constituting the first stretchable electrically-conductive circuit has one electrically-conductive fiber material attached layer 2a formed therein in a horizontal direction, and the elastomer sheet 1b constituting the second stretchable electrically-conductive circuit 1b has five electrically-conductive fiber material attached layers 2b formed therein in a perpendicular direction. Herein, a resistance value of each of the electrically-conductive fiber material attached layer 2a disposed between both ends is measured at each of portions where the electrically-conductive fiber material attached layer 2a and the electrically-conductive fiber material attached layers 2b overlap, and accordingly, stretch can be measured similarly to Example 5. Furthermore, by measuring capacitance between the electrically-conductive fiber material attached layer 2a and the electrically-conductive fiber material attached layers 2b at those portions, pressure and load can be measured.

As described above, since stretch has little influence on a measured value of pressure, in an example in FIG. 20, stretch, pressure, and load in the five portions can be measured independently and simultaneously.

Figures 21, 22:
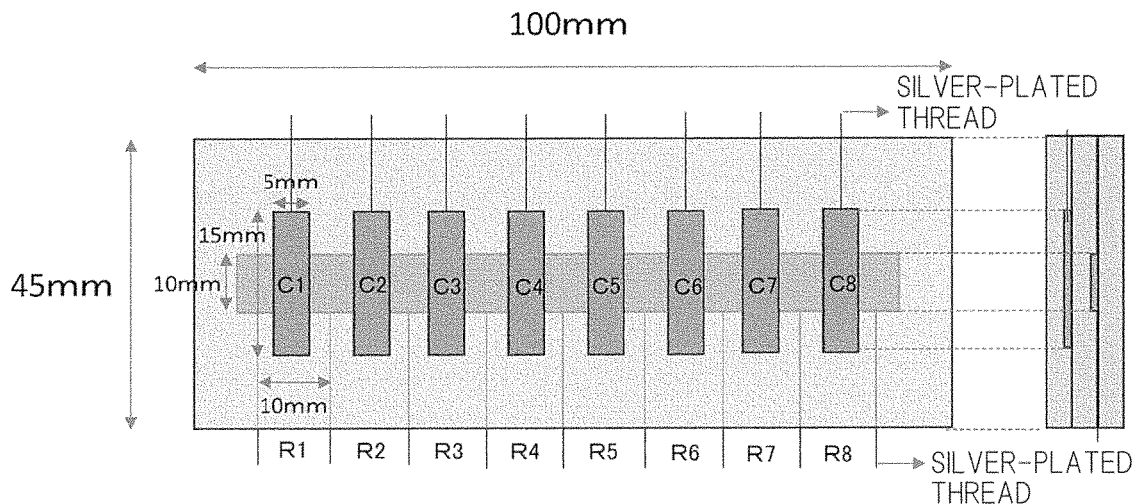
FIG. 21 is a view illustrating an example of measurement according to Example 7.
FIG. 22 is a view illustrating actual measured values of resistance values and capacitance when a load is applied to the example of measurement.

The actual measured results are illustrated in FIG. 21 and FIG. 22.

In the present Example, as illustrated in FIG. 21, the elastomer sheet 1a constituting the first stretchable electrically-conductive circuit and the elastomer sheet 1b constituting the second stretchable electrically-conductive circuit are both rectangular having a size of 100 mm×45 mm. The elastomer sheet 1a has one electrically-conductive fiber material attached layer 2a formed therein in the horizontal direction, the elastomer sheet 1b has eight electrically-conductive fiber material attached layers 2b formed therein in the perpendicular direction, and overlapping portions are formed at eight points from C1 to C8.

FIG. 22 illustrates measured results of resistance values R1 to R8 among the eight electrically-conductive fiber material attached layers 2b when stretch is applied to a portion between C1 and C4 among the eight overlapping portions where capacitance elements are formed and when load is applied to the portions C3 and C7. FIG. 22 further illustrates measured results of capacitance in each of the eight overlapping portions C1 to C8 where the capacitance elements are formed.

In FIG. 23, the measured results are indicated in an upper row, while the actual measured results of stretch rate and load are indicated in a lower row. Based on FIG. 23, it is found that they are highly correlated.

Consequently, by mapping a relation among resistance value, stretch, capacitance, pressure, and load per combination of the first and the second stretchable electrically-conductive circuits, it is possible to accurately measure the relation among stretch, pressure, and load per overlapping portion. Accordingly, for example, when developing sports wears, a relation between a degree of stretch in a specific part and a load applied to a skin is measured, so that an optimum design can be achieved.

As described above, according to the present invention, by simply attaching electrically-conductive fiber materials each having a predetermined diameter and a predetermined length to an adhesive layer of an elastomer sheet, it is possible to produce a low-cost stretchable electrically-conductive circuit having excellent stretchability, bendability, and durability without impairing flexibility of the elastomer sheet, and further, mass production of such a stretchable electrically-conductive circuit can be achieved. Therefore, the stretchable electrically-conductive circuit can be expected to be widely used, for example, as an antenna or wire for RFID devices, a wire for a motion analysis sensor in sports science, a wearable heartbeat/electrocardiogram monitor, a wire in a robot movable portion, a wire for a finger sensor, and a wire for a bendable sensor attached to a finger, an elbow joint, and a knee joint.

Further, by selecting the fiber length and the like of the electrically-conductive fiber material, the stretchable electrically-conductive circuit can be used as a stretch amount sensor. Alternatively, the elastomer sheet is interposed between the electrically-conductive fiber material attached layers in such a way that the electrically-conductive fiber material attached layers are opposed to each other, and accordingly, the stretchable electrically-conductive circuit can also be used as a pressure sensor.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A stretchable electrically-conductive circuit, comprising:
    an elastomer sheet having an adhesive layer corresponding to a wiring region with a predetermined pattern formed on a front surface of the elastomer sheet; and
    electrically-conductive fiber materials each having a predetermined diameter and a predetermined length and attached to the adhesive layer and coming in contact with each other along the wiring region so as to have mutual electrical continuity,
    wherein the electrically-conductive fiber materials relatively move maintaining the mutual electrical continuity so as to maintain the mutual electrical continuity in the wiring region when the elastomer sheet is stretched or bended,
    wherein a front surface of each of the electrically-conductive fiber materials attached to the adhesive layer is sealed with the elastomer sheet or a coated layer formed of a thin film having higher flexibility than the elastomer sheet.

2. The stretchable electrically-conductive circuit according to claim 1, wherein a fiber length of each fiber of the electrically-conductive fiber materials or a wire width of the electrically-conductive fiber materials to be attached is selected to increase the electrically-conductive fiber materials to be detached electrically in accordance with a stretch rate and to increase electric resistance when the elastomer sheet is stretched or bended, so that the stretchable electrically-conductive circuit functions as a stretch amount detection sensor detecting stretch amount.

3. The stretchable electrically-conductive circuit according to claim 2, wherein the electrically-conductive fiber materials attached to two elastomer sheets intersect with each other, and attached layers of the electrically-conductive fiber materials in an intersection portion function as opposing electrodes and an elastomer sheet disposed between the opposing electrodes functions as a capacitor, and capacitance between the opposing electrodes is changed in accordance with a stretch of the elastomer sheet between the electrodes due to pressure and load applied in a perpendicular direction, so that the stretchable electrically-conductive circuit functions as a pressure sensor.

4. The stretchable electrically-conductive circuit according to claim 1, wherein the electrically-conductive fiber materials attached to two elastomer sheets intersect with each other, and attached layers of the electrically-conductive fiber materials in an intersection portion function as opposing electrodes and an elastomer sheet disposed between the opposing electrodes functions as a capacitor, and capacitance between the opposing electrodes is changed in accordance with a stretch of the elastomer sheet between the electrodes due to pressure and load applied in a perpendicular direction, so that the stretchable electrically-conductive circuit functions as a pressure sensor.

5. A stretchable electrically-conductive circuit, comprising:
    an elastomer sheet having an adhesive layer corresponding to a wiring region with a predetermined pattern formed on a front surface of the elastomer sheet; and
    electrically-conductive fiber materials each having a predetermined diameter and a predetermined length and attached to the adhesive layer and coming in contact with each other along the wiring region so as to have mutual electrical continuity,
    wherein the electrically-conductive fiber materials relatively move maintaining the mutual electrical continuity so as to maintain the mutual electrical continuity in the wiring region when the elastomer sheet is stretched or bended,
    wherein both surfaces of the elastomer sheet are configured to be adhesive layers and the elastomer sheet is rolled such that the electrically-conductive fiber material attached to one of the adhesive layers comes inside so as to form a conductive wire-like shape.

6. The stretchable electrically-conductive circuit according to claim 5, wherein the electrically-conductive fiber materials attached to two elastomer sheets intersect with each other, and attached layers of the electrically-conductive fiber materials in an intersection portion function as opposing electrodes and an elastomer sheet disposed between the opposing electrodes functions as a capacitor, and capacitance between the opposing electrodes is changed in accordance with a stretch of the elastomer sheet between the electrodes due to pressure and load applied in a perpendicular direction, so that the stretchable electrically-conductive circuit functions as a pressure sensor.

7. A stretchable electrically-conductive circuit, comprising:
    an elastomer sheet having an adhesive layer corresponding to a wiring region with a predetermined pattern formed on a front surface of the elastomer sheet; and
    electrically-conductive fiber materials each having a predetermined diameter and a predetermined length and attached to the adhesive layer and coming in contact with each other along the wiring region so as to have mutual electrical continuity,
    wherein the electrically-conductive fiber materials relatively move maintaining the mutual electrical continuity so as to maintain the mutual electrical continuity in the wiring region when the elastomer sheet is stretched or bended,
    wherein the electrically-conductive fiber materials attached to two elastomer sheets intersect with each other, and attached layers of the electrically-conductive fiber materials in an intersection portion function as opposing electrodes and an elastomer sheet disposed between the opposing electrodes functions as a capacitor, and capacitance between the opposing electrodes is changed in accordance with a stretch of the elastomer sheet between the electrodes due to pressure and load applied in a perpendicular direction, so that the stretchable electrically-conductive circuit functions as a pressure sensor.

8. The stretchable electrically-conductive circuit according to claim 7, wherein elastomer sheets in which the electrically-conductive fiber materials are not attached are laminated in the intersection portion.

9. The stretchable electrically-conductive circuit according to claim 8, wherein an opening is provided in a lower portion of the intersection portion of at least one layer of the elastomer sheets in which the electrically-conductive fiber materials are not attached.

10. The stretchable electrically-conductive circuit according to claim 7, wherein a plurality of rows of the attached layers of the electrically-conductive fiber materials are formed on one of the two elastomer sheets, and the intersection portions are formed at a plurality of portions in a longitudinal direction with respect to the attached layer of the electrically-conductive fiber materials formed in the other elastomer sheet.

11. The stretchable electrically-conductive circuit according to claim 7, wherein one of the two elastomer sheets functions as a stretch amount detection sensor and the intersection portion functions as a pressure sensor.

* * * * *